United States Patent
Ekbote et al.

(10) Patent No.: US 9,136,382 B2
(45) Date of Patent: Sep. 15, 2015

(54) NATIVE DEVICES HAVING IMPROVED DEVICE CHARACTERISTICS AND METHODS FOR FABRICATION

(71) Applicant: QUALCOMM Incorporated, San Diego, CA (US)

(72) Inventors: Shashank S. Ekbote, San Diego, CA (US); Rongtian Zhang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 140 days.

(21) Appl. No.: 13/974,103

(22) Filed: Aug. 23, 2013

(65) Prior Publication Data

US 2014/0035067 A1   Feb. 6, 2014

Related U.S. Application Data

(62) Division of application No. 12/770,191, filed on Apr. 29, 2010, now Pat. No. 8,541,269.

(51) Int. Cl.
*H01L 29/76* (2006.01)
*H01L 29/94* (2006.01)
(Continued)

(52) U.S. Cl.
CPC ...... *H01L 29/7833* (2013.01); *H01L 21/26586* (2013.01); *H01L 29/1083* (2013.01); *H01L 29/66492* (2013.01)

(58) Field of Classification Search
CPC .................................. H01L 21/26586
USPC ................................ 257/382–410
See application file for complete search history.

(56) References Cited

U.S. PATENT DOCUMENTS 5,759,901 A * 6/1998 Loh et al. ................ 438/305
5,976,937 A   11/1999 Rodder et al.
(Continued)

FOREIGN PATENT DOCUMENTS

CN   1547255 A   11/2004
EP   0899793 A2   3/1999
(Continued)

OTHER PUBLICATIONS

International Preliminary Report on Patentability—PCT/US2011/032904, The International Bureau of WIPO—Geneva, Switzerland, Nov. 13, 2012.
(Continued)

*Primary Examiner* — Cuong Q Nguyen
(74) *Attorney, Agent, or Firm* — Donald D. Min

(57) ABSTRACT

A method for fabricating a native device is presented. The method includes forming a gate structure over a substrate starting at an outer edge of an inner marker region, where the gate structure extends in a longitudinal direction, and performing MDD implants, where each implant is performed using a different orientation with respect to the gate structure, performing pocket implants, where each implant is performed using a different orientation with respect to the gate structure, and concentrations of the pocket implants vary based upon the orientations. A transistor fabricated as a native device, is presented, which includes an inner marker region, an active outer region which surrounds the inner marker region, a gate structure coupled to the inner marker region, and first and second source/drain implants located within the active outer region and interposed between the first source/drain implant and the second source/drain implant.

12 Claims, 5 Drawing Sheets

(51) Int. Cl.
*H01L 31/062* (2012.01)
*H01L 31/113* (2006.01)
*H01L 29/78* (2006.01)
*H01L 21/265* (2006.01)
*H01L 29/10* (2006.01)
*H01L 29/66* (2006.01)

(56) References Cited

U.S. PATENT DOCUMENTS

| | | |
|---|---|---|
| 6,455,362 B1 * | 9/2002 | Tran et al. ............... 438/194 |
| 6,709,938 B2 | 3/2004 | Miles et al. |
| 7,208,362 B2 | 4/2007 | Chidambaram |
| 2003/0111683 A1 | 6/2003 | Yoshiyama |
| 2005/0230764 A1 | 10/2005 | Chou |
| 2009/0029516 A1 | 1/2009 | Obradovic et al. |
| 2011/0266635 A1 | 11/2011 | Ekbote et al. |

FOREIGN PATENT DOCUMENTS

| | | |
|---|---|---|
| JP | H05152321 A | 6/1993 |
| JP | 6350040 A | 12/1994 |
| JP | H09289315 A | 11/1997 |
| JP | H10229134 A | 8/1998 |
| JP | H11135791 A | 5/1999 |
| JP | 2001274263 A | 10/2001 |
| JP | 2003188269 A | 7/2003 |
| JP | 2005136000 A | 5/2005 |
| JP | 2005183521 A | 7/2005 |
| KR | 100442303 B1 | 7/2004 |

OTHER PUBLICATIONS

International Search Report and Written Opinion—PCT/US2011/032904, ISA/EPO—Jul. 14, 2011.

* cited by examiner

NATIVE DEVICES HAVING IMPROVED DEVICE CHARACTERISTICS AND METHODS FOR FABRICATION

CLAIM OF PRIORITY UNDER 35 U.S.C. §120

The present Application for Patent is a Divisional of patent application Ser. No. 12/770,191 entitled "NATIVE DEVICES HAVING IMPROVED DEVICE CHARACTERISTICS AND METHODS FOR FABRICATION" filed Apr. 29, 2010 pending, and assigned to the assignee hereof and hereby expressly incorporated by reference herein in its entirety.

FIELD OF DISCLOSURE

Disclosed embodiments are generally directed to semiconductor devices and the fabrication thereof. More particularly, embodiments are related to native devices fabricated with a pocket implant having a reduced dopant concentration in the channel.

BACKGROUND

A native device may include NMOS transistors which can be formed without threshold adjusting dopants in the channel region as found in conventional MOS transistors. For example, a native NMOS transistor may be fabricated without PWELL and VTN implants typically utilized in a conventional NMOS device. This elimination of the threshold adjusting dopants can improve the mobility of charge carriers within the channel. Increased mobility can reduce the threshold voltage (VT) and body effect, and further increase the transconductance ($g_m$) of a device, which may be beneficial for analog and mixed signal applications.

Conventional native devices typically also include pocket implants (also called as halo implants) to control the short channel effect. However, with shrinking device dimensions and the usage of heavier pocket implants, the channel mobility of the native device is being reduced. Accordingly, it is becoming increasingly difficult to achieve a low VT and a high $g_m$ using native fabrication. Moreover, this reduced mobility may also increase the variations of the characteristics between adjacent devices. In summary, the heavy doping of the pocket implants can contravene the original purpose for using the native fabrication approach.

Accordingly, there is a need for fabrication techniques for native devices that can reduce the dopant concentration within the device channel to maintain low threshold voltages, high transconductance, and improved consistency among fabricated devices.

SUMMARY

The disclosed embodiments of the disclosure are directed to methods for fabricating native devices having improved device characteristics.

An embodiment for fabricating a native device is described. This embodiment may include forming a gate structure over a substrate starting at an outer edge of an inner marker region, wherein the gate structure extends in a longitudinal direction. The method may further included performing Medium Doped Drain (MDD) implants, wherein each implant is performed using a different orientation with respect to the gate structure. The method may also include performing pocket implants, wherein each implant is performed using a different orientation with respect to the gate structure, and further wherein concentrations of the pocket implants vary based upon the orientations. When performing the source drain implants, the aforementioned embodiment may further include performing the MDD implants from a first set of orientations which are substantially parallel to the longitudinal direction of the gate structure; and performing the MDD implants from a second set of orientations which are substantially perpendicular to the longitudinal direction of the gate structure. When performing pocket implants, the embodiment may further include performing the pocket implants from a first set of orientations which are substantially parallel to the longitudinal direction of the gate structure, and performing the pocket implants from a second set of orientations which are substantially perpendicular to the longitudinal direction of the gate structure.

In another embodiment, a transistor fabricated as a native device is described. The embodiment may include an inner marker region, and an active outer region which surrounds the inner marker region. This embodiment may further include a gate structure coupled to the inner marker region, and a first source/drain implant located within the active outer region. The transistor may also include a second source/drain implant located within the active outer region, wherein the gate structure is interposed between the first source/drain implant and the second source/drain implant.

BRIEF DESCRIPTION OF THE DRAWINGS

The accompanying drawings are presented to aid in the description of embodiments are provided solely for illustration of the embodiments and not limitation thereof.

DETAILED DESCRIPTION

Aspects of the embodiments are disclosed in the following description and related drawings directed to such embodiments. Alternate embodiments may be devised without departing from the scope of the invention. Additionally, well-known elements of the embodiments will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments of the disclosure" does not require that all embodiments of the disclosure include the discussed feature, advantage or mode of operation.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1A:
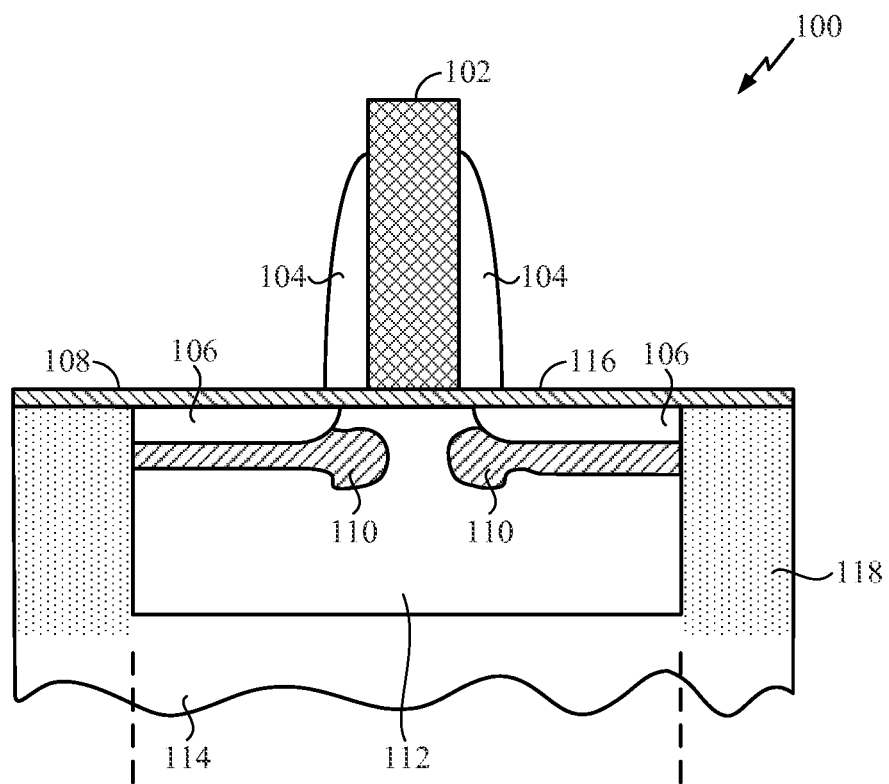
FIG. 1A is a side elevation illustration showing portions of a conventional native device.

FIG. 1A is a side elevation illustration showing portions of a conventional native device 100. The native device 100 may have a gate structure 102 which may be formed on top of an oxide insulating layer 108. The gate structure 102 may be made out of poly-silicon material, or metal. On each side of the gate structure 102, sidewalls 104 may be formed to separate the implants from the poly-silicon material with respect to the channel underneath the gate. Medium Doped Drain (MDD) implants 106 may be formed on either side of the gate structure 102. Beneath the MDD implants 106, high concentration pocket implants 110 may be formed. Not shown in the illustration are the source/drain implants which may be formed below the high concentration pocket Implants 110. The MDD implants 106, the high concentration pocket implants 110, and the source/drain implants (not shown) reside within an inner active region 116 of the device. Within the inner active region 116, a channel region 112 can be created for charge transport when the appropriate voltages are applied to terminals associated with the gate, drain, and source implants of the device. Region 118 is a native device marker region which can be drawn to prevent WELL/VT implants to be added into the active region of this transistor 114. Moreover, the marker region 116 may be used to separate the native devices from the logic devices which may also exist on the semiconductor die.

Figure 1B:
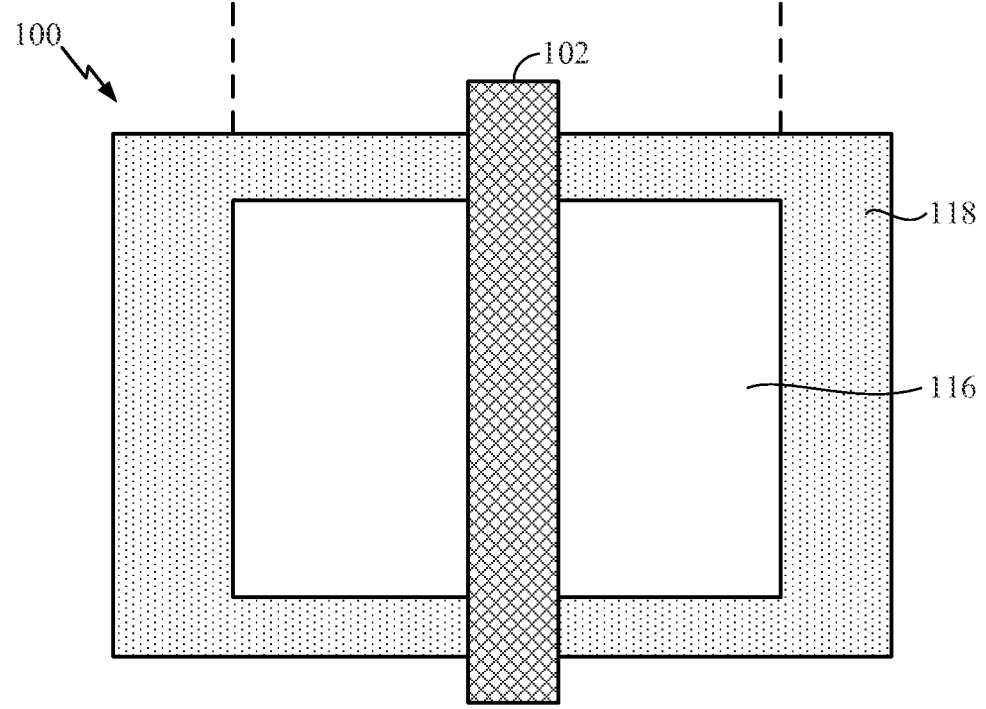
FIG. 1B is a top plan illustration of the conventional native device depicted in FIG. 1A.

FIG. 1B is a top plan illustration of the conventional native device 100 depicted in FIG. 1A. The longitudinal extent of the gate structure 102 extends over the inner active region of the device. In the conventional native device, the active region 116 is contained within the marker region. The outer edge of the marker region 118 determines where an MDD mask is placed during the fabrication of the device. The MDD mask can used to control concentration of implant material in the inner active region 116. The high concentration pocket implants 110 may be placed in the inner active region 116 to control the short channel effect. However, the higher concentration of dopants resulting from these implants can adversely affect various parameters of the native device 100. Such parameters may include the threshold voltage VT and the transconductance ($g_m$) of the device.

Embodiments of the disclosure are directed to native devices which may overcome the aforementioned affects of high concentration pocket implants by reducing their concentration, while maintaining their beneficial purpose of controlling the charge channel effect. This may be accomplished, for example, inverting the geometry of the active region and marker regions from the conventional arrangement shown above in FIGS. 1A and 1B. Specifically, in the embodiments, the marker region may be surrounded by the active region of the native device. This change allows placement of masks during fabrication to be spaced closer to the poly-silicon gate of the device. The closer placement of the mask can result in a fabrication geometry which permits subsequent implant operations to form an MDD implant in the active region, while impeding the implant operations associated with the pocket implants. This new arrangement can thus reduce the concentration of the pocket implants in the active region to improve the characteristics of the native device. Moreover, the arrangement may have the additional advantage of being performed without additional masking levels during the fabrication of the device, and is compatible with existing foundry processes. Such processes may include 45 nm processes and beyond. By reducing the concentration of the pocket implants, the VT may be reduced, the $g_m$ may be increased, and the consistency of the parameters across devices formed on the substrate may be improved.

Figure 2A:
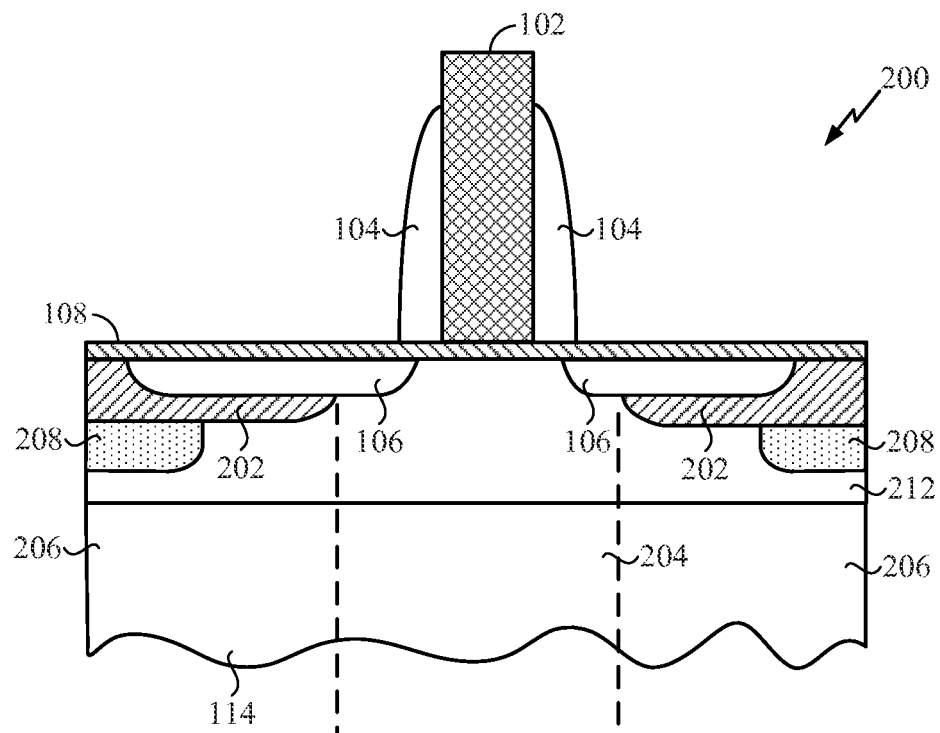
FIG. 2A is a side elevation illustration showing portions of an exemplary native device having reduced pocket implants.

FIG. 2A is a side elevation illustration showing portions of an exemplary native device 200 having reduced pocket implants 202. The native device 200, which may include NMOS transistors that can be integrated into at least one semiconductor die, can have a gate structure 102 which may be formed on top of an oxide insulating layer 108. The gate structure 102 may be made out of poly-silicon material. On each side of the gate structure 102, sidewalls 104 may be formed in order to provide appropriate space between the gate structure 102 and the MDD implants 106. The MDD implants 106 may be formed on either side of the gate structure 102 beneath the oxide layer 108. Beneath the MDD implants 106, low concentration pocket implants 202 may be formed. Source/Drain implants 208 may reside under the low concentration pocket implants 202.

The MDD implants 106 may reside partly inside the inner marker region 204 and partly within the outer active region 206. The low concentration pocket implants 202 may reside outside the inner marker region 204 and within the outer active region 206. The source/drain implants 208 may reside within the outer active region 116 of the native device 200. The inner marker region 204 may be drawn to mark the outer active region 206 that will not receive a high concentration implant. The placement of the marker region 204 is inverted from a conventional native device, wherein the marker region 204 may be surrounded by the active region 206. This arrangement allows mask to be placed closer to the gate 102, and thus impede subsequent implantation of the pocket implants to reduce their concentration. A channel region 212 can be created (within the NWELL region) for charge transport, when the appropriate voltages arc applied to terminals associated with the gate, drain, and source implants of the device.

As can be seen from FIG. 2A, the low concentration pocket implants 202 do not extend as far into the channel region 202 as the high concentration pockets 110 extended into channel region 112 of the conventional native device 100. This improves the charge mobility of the channel region 212 of the device 200.

Figure 2B:
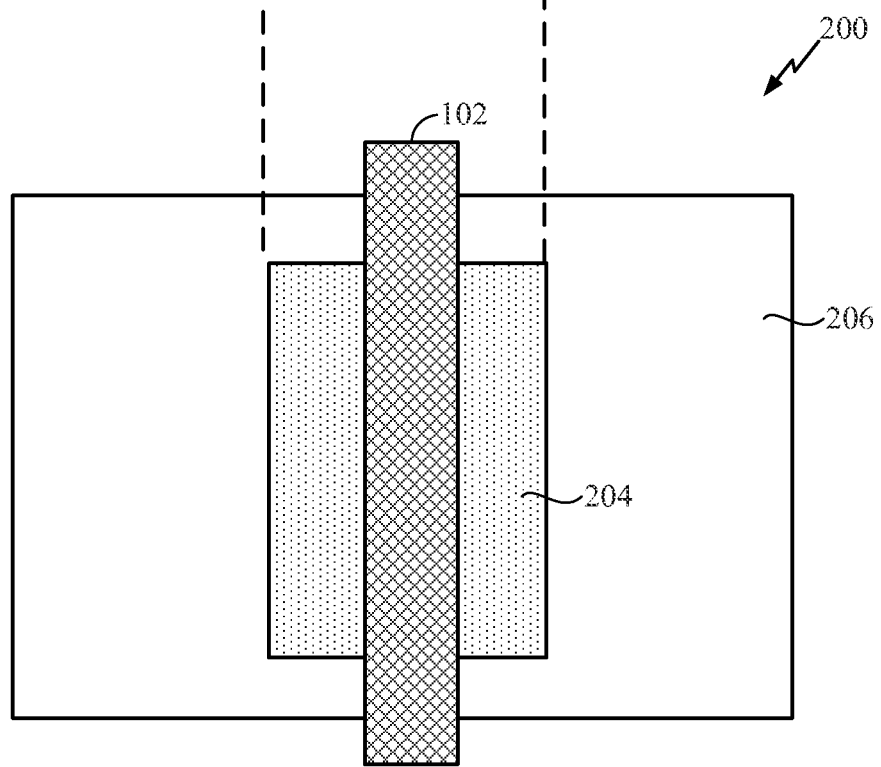
FIG. 2B is a top plan illustration showing the exemplary native device shown in FIG. 2A.

FIG. 2B is a top plan illustration of the native device 200 depicted in FIG. 2A. The longitudinal extent of the gate structure 102 extends over the inner marker region 204 of the device. As can be seen, the arrangement of the embodiment allows the inner marker region 204 to be surrounded by the outer active region 206. Accordingly, this arrangement may be considered as being reversed from the corresponding regions 116 and 118 shown in the conventional native device 100 to reduce the spacing between the gate electrode 102, and the fabrication (MDD) mask, which will be described in more detail below.

The native device may be used to realize circuits and/or various functional blocks within mobile devices. As used herein, the term "mobile device" may refer to any type of wireless communication device which may transfer information over a network. The mobile device may be any cellular mobile terminal, personal communication system (PCS) device, portable data units such as personal navigation devices, GPS enabled devices, laptops, set-top boxes, music players, video players, personal digital assistant, fixed location data units such as meter reading equipment, or any other suitable device that stores or retrieves data or computer instructions or any combination thereof. The mobile device may be capable of receiving and processing network and/or Satellite Position System signals. Moreover, as used herein, the term "network" may refer to any wireless communication network, including a wireless wide area network (WWAN), a wireless local area network (WLAN), a wireless personal area network (WPAN), and so on. A WWAN may be a Code Division Multiple Access (CDMA) network, a Time Division Multiple Access (TDMA) network, a Frequency Division Multiple Access (FDMA) network, an Orthogonal Frequency Division Multiple Access (OFDMA) network, a Single-Carrier Frequency Division Multiple Access (SC-FDMA) network, and so on. A CDMA network may implement one or more Radio Access Technologies (RATs) such as cdma2000, Wideband-CDMA (W-CDMA), and so on. Cdma2000 includes IS-95, IS-2000, and IS-856 standards. A TDMA network may implement Global System for Mobile Communications (GSM), Digital Advanced Mobile Phone System (D-AMPS). or some other RAT. GSM and W-CDMA are described in documents from a consortium named "3rd Generation Partnership Project" (3GPP). Cdma2000 is described in documents from a consortium named "3rd Generation Partnership Project 2" (3GPP2), 3GPP and 3GPP2 documents are publicly available. A WLAN may be an IEEE 802.11x network, and a WPAN may be a Bluetooth network, an IEEE 802.15x, or some other type of network. The techniques may also be used for any combination of WWAN, WLAN and/or WPAN. Although the Figures below illustrate remote units according to the teachings of the disclosure, the disclosure is not limited to these exemplary illustrated units. Embodiments of the disclosure may be suitable employed in any device which includes active integrated circuitry include memory and on-chip circuitry for test and characterization.

The foregoing disclosed devices and methods are typically designed and configured into GDSII and GERBER computer files, stored on a computer readable media. These files re in turn provided to fabrication handlers who fabricate device based on these files. The resulting produces are semiconductor wavers that are then cut into semiconductor die and packaged into a semiconductor chip. The chips may then be employed in devices described herein.

Accordingly, further referring to FIG. 2A, one embodiment of a native device may be a transistor which includes a means for providing a gate connection (102), a first region means for permitting placement of photo-resists in close proximity to the gate connection means so that implant operations for forming pocket implants are impeded (204); a second region means for surrounding the first region means (206); a means for providing a first source/drain connection which is located within the second region means (208); and a means for providing a second source/drain connection (208) which is located within the second region means, wherein the gate connection means is interposed between the first and second source/drain connection means. The transistor may further include a means for insulating the gate connection means (108), and a first and second means for providing medium doped sections positioned between the insulating means and the first and second source/drain connection means, respectively (106). The transistor may further include a first means for providing a low concentration pocket section positioned between first medium doped section means and the first source/drain connection means (202), and a second means for providing a low concentration pocket section positioned between second medium doped section means and the second source/drain connection means (202).

Figure 3:
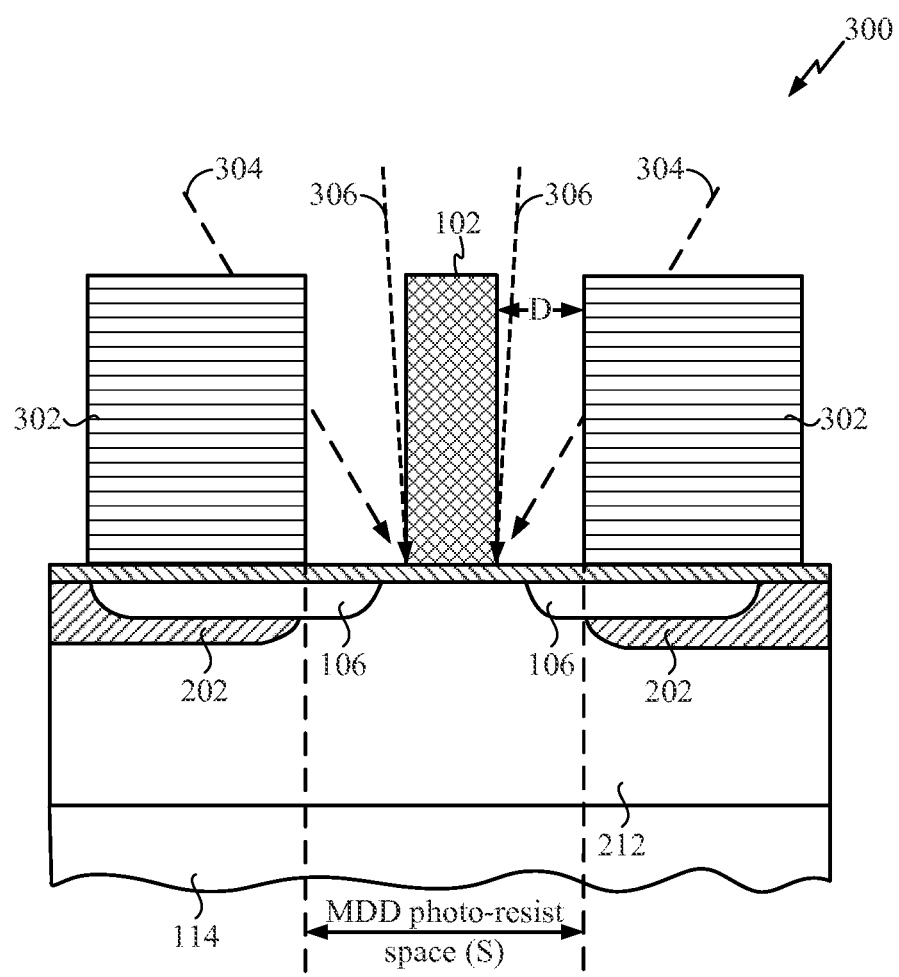
FIG. 3 is a side elevation illustration showing various implant geometries of an exemplary native device having reduced pocket implants.

FIG. 3 is a side elevation illustration showing various implant geometries of an exemplary native device 300 having reduced pocket implants. During fabrication, MDD photo-resists 302 may be formed on the oxide insulation 108. The photo-resist may be placed at the outer edges of the inner marker region 204, thus creating an MDD photo-resist space S adjacent to the outer active region 212. The space S depends upon the distance D the photo-resist is placed from the gate structure 102, which is reduced from space used in the conventional device given the reversed arrangement of the marker region and active regions described above.

The MDD implants may be formed using ion beam implantation, represented by implant vector 306. When the MDD implants 106 are formed, the implant vectors 306 are made at a small angle with respect to the vertical direction of the gate structure 102. This angle, denoted herein as a, may be between 0 and 6 degrees. A typical value a may be approximately 3 degrees. The angle of implant vectors 306 is small enough so that implant is not impeded by the photo-resists 302. The low concentration pocket implants 202 may be formed using ion beam implantation using implant vectors 304. The angle of implant vectors 304, with respect to the vertical direction of gate structure 102, is larger than corresponding angles of implant vectors 306. For implant vectors 304, the angle n may be between 15 and 60 degrees, wherein a typical angle may be approximately 40 degrees. The pocket implant vectors 304 are made at such an angle so the photo-resists 302 impede the flow of ions into the device, depending upon the orientation of the pocket implant vector 304.

As will be explained in more detail below, in one orientation (as shown in FIG. 3), the majority of the implant is blocked by photo-resist 302; however, in other orientations, the pocket implant vector 304 is not impeded by photo-resist 302, and the ions reach the device to from the low concentration pocket implant 202. Moreover, the low concentration pocket implants 202 will introduce halo dopants in the device 300 if the width of the device is greater than D. While the low concentration implants 202 will increase VT, but VT will depend on diffusion length of the pocket species, not on the angle. Accordingly the resulting VT in device 300 will still be lower than the conventional device 100.

Figure 4A:
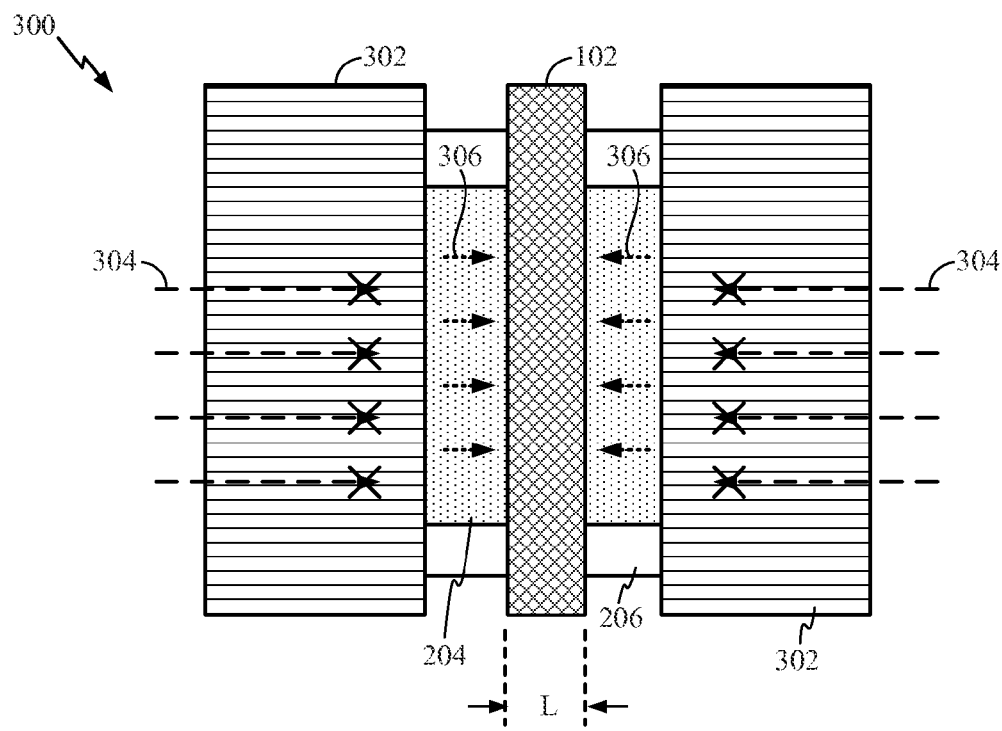
FIG. 4A is a top plan illustration showing implant geometries for orientations where the pocket implants are prevented from reaching the channel region.
Figure 4B:
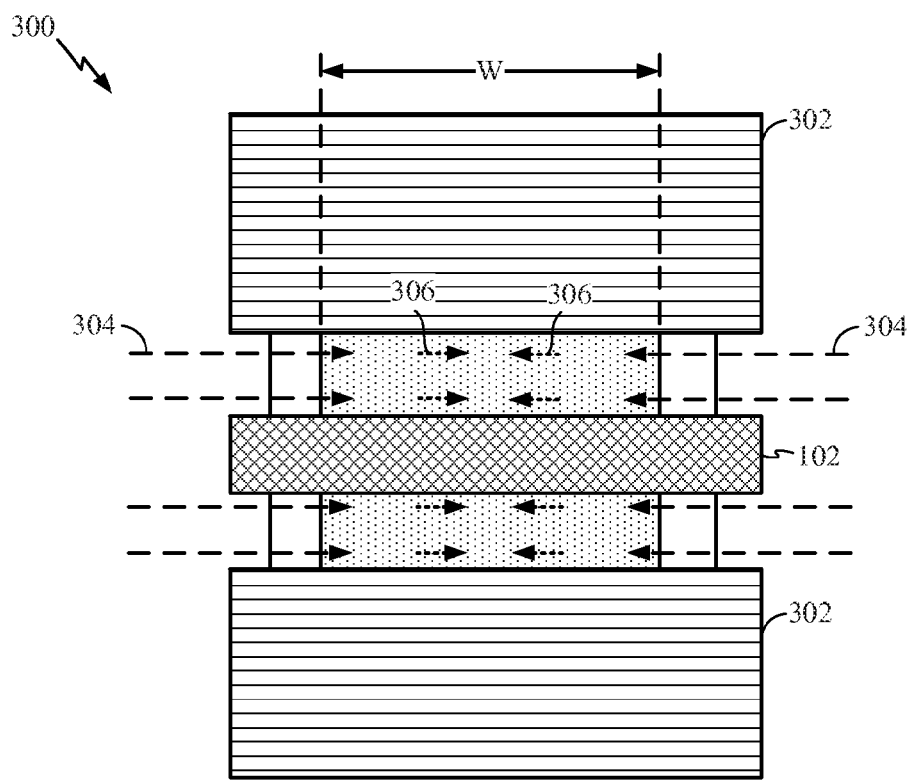
FIG. 4B is a top plan illustration showing implant geometries for orientations where the pocket implants are allowed to reach the channel region.

FIGS. 4A and 4B show layout views of device 300 for different implant orientations performed during the fabrication process. As shown in these figures, the pattern for MDD photo-resist 302 may be derived so that along length L of native device 300, two pocket implants are masked in the orientation as shown in FIG. 4A. It should be understood that the masking of the pocket implants shown in FIG. 4A are independent of the rotation of the gate structure 102. In the orientation shown in FIG. 4B, the implants along the width (W) of the native device (depending upon the width of transistor), the pocket implants will be masked (for smaller W), or will be implanted. It should be noted that during the fabrication process, the implantations for each orientation are typically not performed simultaneously, as may be suggested b FIGS. 4A and 4B. Details associated with FIGS. 4A and 4B are provided below.

FIG. 4A is a top plan illustration showing implant geometries for orientations of device 300 where the pocket implants are prevented from reaching the channel region. In FIG. 4A, the device 300 is oriented so that both MDD implant vectors 306 and both pocket implant vectors 304 are substantially perpendicular to the longitudinal direction of the gate structure 102. The MDD photo-resists 302 may be laterally spaced from the gate structure 102 in directions traverse to the longitudinal direction of the gate structure. The edge of each MDD photo-resist may be placed at the outer edge of the inner marker region 204. During the implantation of MDD implants 106, the implant vectors 306 are not impeded by MDD photo-resists 302. However, during the implant step associated with the pocket implants, the pocket implant vectors 304 are impeded by MDD photo-resists 302.

FIG. 4B is a top plan illustration showing implant geometries for orientations of device 300 where the pocket implants are allowed to reach the channel region. Here, both implant vectors 304 and 306 will deposit material onto the device. Accordingly, the low concentration pocket implants 202 will be formed and not masked during each pocket implantation step at this device orientation.

Figure 5:
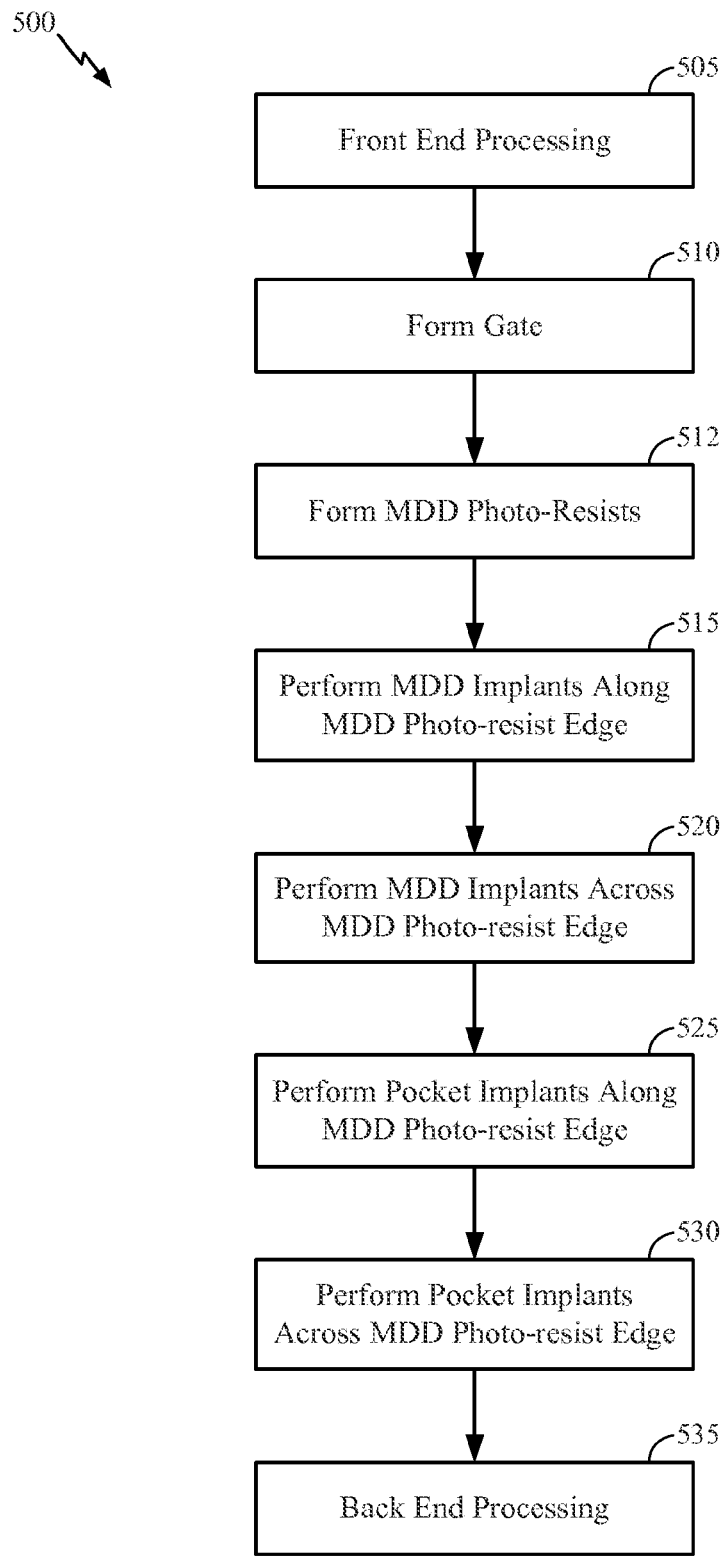
FIG. 5 is a simplified flowchart illustrating an exemplary process for manufacturing a native device having reduced concentration pocket implants.

FIG. 5 is a simplified flowchart illustrating an exemplary process 500 for manufacturing a native device having a reduced concentration pocket implants. Initially, front end processing may take place which may include, for example, isolation processing such as shallow trench isolation (STI) formation, oxide insulation layer formation, n-well and/or p well formation, channel engineering implants, as well as other processing operations (Block 505). A gate structure 102 may be formed over the oxide insulation layer 108. The gate structure may be made using poly-silicon and formed by conventional techniques (Block 510). MDD photo-resists 302 may be formed over the oxide insulation layer 108 (Block 512), The photo-resists may start at the outer edge of the marker region 204, and extend laterally outward. Each photo-resist may be laterally spaced a distance D from the gate structure, in a direction traverse to the longitudinal direction of the gate structure. The heights of the photo-resists are formed such that each one impedes the pocket implants when they are performed from orientations that are substantially perpendicular to the longitudinal direction as shown in FIG. 4B.

Given the implant angle of the implant vector 304 is n and the height of the MDD 302 photo-resists is H, the distance D between a photo-resist 302 and the gate structure 102 should take on a value so that the pocket implants from implant vector 304 will be sufficiently impeded. The distance D may be limited by lithography tool capability and/or design rules.

Two MDD implants may be then performed along the MDD photo-resist edge 302 as shown in FIG. 4B (Block 515). These implantations may take place in two separate steps. Two more MDD implants may then be performed across the MDD photo-resist edge 302 as shown in FIG. 4A, which also may be performed in two separate steps (Block 520). Each MDD implantation may be performed using any conventional ion implantation techniques.

The pocket implantations may be performed along the MDD photo-resist edge 302 as shown in FIG. 4B (Block 525). These implantations may take place in two separate steps. With this orientation, the pocket implants will be implanted into the device if the width of the device (W) is sufficient as described above. Two more pocket implants may be then be performed across the MDD photo-resist edge 302 as shown in FIG. 4A (Block 530). These implantations may also take place in two separate steps. In this instance, the pocket implants will be impeded by the MDD photo-resist 302. Each pocket implantation may be performed using any known ion implantation techniques.

After the MDD and pocket implants are formed, back end processing may take place, and include, for example, source/drain formation, and other back end processing (Block 535).

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the disclosure can include a computer readable media embodying a method for fabricating native devices having improved device characteristics.

While the foregoing disclosure shows illustrative embodiments, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A transistor fabricated as a native device, comprising:
an inner marker region;
an active outer region which surrounds the inner marker region;
a gate structure having a central portion over the inner marker region and a first end portion and a second end portion projecting from the inner marker region over the active outer region, the gate structure extending in a longitudinal direction;
a first medium doped drain implant having a first orientation that is different with respect to the longitudinal direction;
a second medium doped drain implant having a second orientation that is different with respect to the longitudinal direction;
a first low concentration pocket implant located within the active outer region;
a second low concentration pocket implant located within in the active outer region;
a first source/drain implant located within the active outer region; and
a second source/drain implant located within the active outer region, wherein the gate structure is interposed between the first source/drain implant and the second source/drain implant.

2. The transistor according to claim 1, further comprising:
an oxide layer position below the gate structure; and
wherein the first medium doped drain implant is positioned between the oxide layer and the first source/drain implant and the second medium doped drain implant is positioned between the oxide layer and the second source/drain implants.

3. The transistor according to claim 2,
wherein the first low concentration pocket implant is positioned between the first medium doped drain implant and the first source/drain implant; and
a second low concentration pocket implant is positioned between the second medium doped drain implant and the second source/drain implant.

4. The transistor according to claim 1, wherein the transistor is native NMOS device.

5. The transistor according to claim 1, integrated in at least one semiconductor die.

6. The transistor according to claim 1, further comprising a device, selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and an automotive device in an automotive vehicle, and further including the device.

7. A transistor fabricated as a native device, comprising:
a means for providing a gate connection, the gate connection means extending in a longitudinal direction;
a first region means for permitting placement of photoresists in close proximity to the gate connection means so that implant operations for forming pocket implants are impeded;
a second region means for surrounding the first region means;
a means for providing a first medium doped drain implant having a first orientation that is different with respect to the longitudinal direction;
a means for providing a second medium doped drain implant having a second orientation that is different with respect to the longitudinal direction;
a means for providing a first low concentration pocket implant located within the second region means;
a means for providing a second low concentration pocket implant located within the second region means;
a means for providing a first source/drain connection which is located within the second region means; and
a means for providing a second source/drain connection which is located within the second region means, wherein the gate connection means is interposed between the first and second source/drain connection means.

8. The transistor according to claim 7, further comprising:
a means for insulating the gate connection means; and
wherein the first medium doped drain implant means is positioned between the insulating means and the first source/drain connection means and the second medium doped drain implant means is positioned between the insulating means and the second source/drain connection means.

9. The transistor according to claim 8,
wherein the first low concentration pocket implant means is positioned between first medium doped drain implant means and the first source/drain connection means; and
the second low concentration pocket implant means is positioned between second medium doped drain implant means and the second source/drain connection means.

10. The transistor according to claim 7, wherein the transistor is native NMOS device.

11. The transistor according to claim 7, integrated in at least one semiconductor die.

12. The transistor according to claim 7, further comprising a device, selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and an automotive device in an automotive vehicle, and further including the device.

* * * * *